United States Patent
Lee et al.

(10) Patent No.: US 7,522,335 B2
(45) Date of Patent: Apr. 21, 2009

(54) BROAD-ANGLE MULTILAYER MIRROR DESIGN

(75) Inventors: Sang Hun Lee, Sunnyvale, CA (US);
Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/811,607

(22) Filed: Mar. 29, 2004

(65) Prior Publication Data

US 2005/0213198 A1    Sep. 29, 2005

(51) Int. Cl.
*F21V 9/04*    (2006.01)
*G21K 1/06*    (2006.01)

(52) U.S. Cl. .......................... 359/359; 359/586; 378/84
(58) Field of Classification Search ......... 359/350–361, 359/557–590
See application file for complete search history.

(56) References Cited

U.S. PATENT DOCUMENTS

| | | | |
|---|---|---|---|
| 5,071,240 A | 12/1991 | Ichihara et al. | 359/366 |
| 5,212,588 A | 5/1993 | Viswanathan et al. | 359/355 |
| 5,265,143 A * | 11/1993 | Early et al. | 378/84 |
| 5,686,728 A | 11/1997 | Shafer | 250/492.2 |
| 5,815,310 A | 9/1998 | Williamson | 359/365 |
| 5,958,605 A * | 9/1999 | Montcalm et al. | 428/627 |
| 6,011,646 A * | 1/2000 | Mirkarimi et al. | 359/359 |
| 6,033,079 A | 3/2000 | Hudyma | 359/857 |
| 6,110,607 A * | 8/2000 | Montcalm et al. | 428/641 |
| 6,183,095 B1 | 2/2001 | Hudyma | 359/857 |
| 6,188,513 B1 | 2/2001 | Hudyma et al. | 359/366 |
| 6,262,826 B1 | 7/2001 | Shafer | 359/208 |
| 6,333,961 B1 * | 12/2001 | Murakami | 378/35 |
| 6,396,900 B1 * | 5/2002 | Barbee et al. | 378/84 |
| 6,441,963 B2 * | 8/2002 | Murakami et al. | 359/584 |
| 2003/0099034 A1 | 5/2003 | Mann et al. | 359/359 |

FOREIGN PATENT DOCUMENTS

| | | |
|---|---|---|
| EP | 1348984 A1 | 10/2003 |
| EP | 1367605 A1 | 12/2003 |

OTHER PUBLICATIONS

Stearns et al., "Multilayer Mirror Technology for Soft-X-Ray Projection Lithography", Applied Optics, vol. 32, No. 34, Dec. 1, 1993, XP000414602.

* cited by examiner

*Primary Examiner*—Thong Nguyen
(74) *Attorney, Agent, or Firm*—George Chen (57) ABSTRACT

According to one embodiment a broad-angle multilayer (ML) mirror system is disclosed. The ML mirror includes a multiple layer structure configured to provide uniform reflectivity over a wide range of angles with small phase shifts.

6 Claims, 11 Drawing Sheets

BROAD-ANGLE MULTILAYER MIRROR DESIGN

FIELD OF THE INVENTION

The present invention relates to high numerical aperture (NA) extreme ultra-violet (EUV) lithographic optics; more particularly, the present invention relates to a multilayer (ML) mirror for broad acceptance angles at EUV wavelengths.

BACKGROUND

Extreme Ultraviolet (EUV) lithography is a lithography technique that targets very small feature sizes (e.g., 32 nm node and below). EUV light may be produced using a small, hot plasma that will efficiently radiate at a desired wavelength (e.g., in a range of approximately 11 nm to 15 nm). Due to such short wavelengths, the use of refractive optics in the system is ineffective. Thus, reflective mirrors are to be implemented for the optics. To promote the reflectivity at EUV wavelengths, multilayer (ML) coatings, featuring alternating layers of molybdenum and silicon (Mo/Si) or molybdenum and beryllium (Mo/Be), are used.

ML mirrors typically used in current EUV optical systems have a constant thickness Mo/Si (e.g., similar to a Bragg's reflector). The ML includes 40-80 bi-layers of the Mo/Si pair to enhance EUV reflections. Further, the bi-layer has a constant period of 6.9 nm with approximately 2.8 nm of Mo and approximately 4.1 nm of Si. However, a problem exists for this type of ML mirror in that it has approximately 12° of the maximum acceptance angle. At this maximum angle, an approximate 16% reflectivity loss occurs with approximately 20° of phase shifts.

Such a small acceptance angle often imposes a significant limitation in designing high numerical aperture (NA) EUV optical systems. This limitation requires optical designers to use multiple mirrors with high asphericity. For a typical six-mirror system (with a NA higher than 0.25), it is possible to have pupil apodizations with large phase shifts (adding out-of-plane distortion (OPD) in the system) due to the acceptance angle limitations of the current ML mirrors. Thus, for high NA optics, more number of mirrors have to be used. Also, graded ML mirrors are sometimes employed for azimuthally symmetric optical element in the system.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

FIG. 6 is a graph illustrating one embodiment of a reflectivity wavelength for a ML mirror while

DETAILED DESCRIPTION

A broad-angle multilayer (ML) mirror design for high numerical aperture (NA) extreme ultra-violet (EUV) lithographic optics is described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
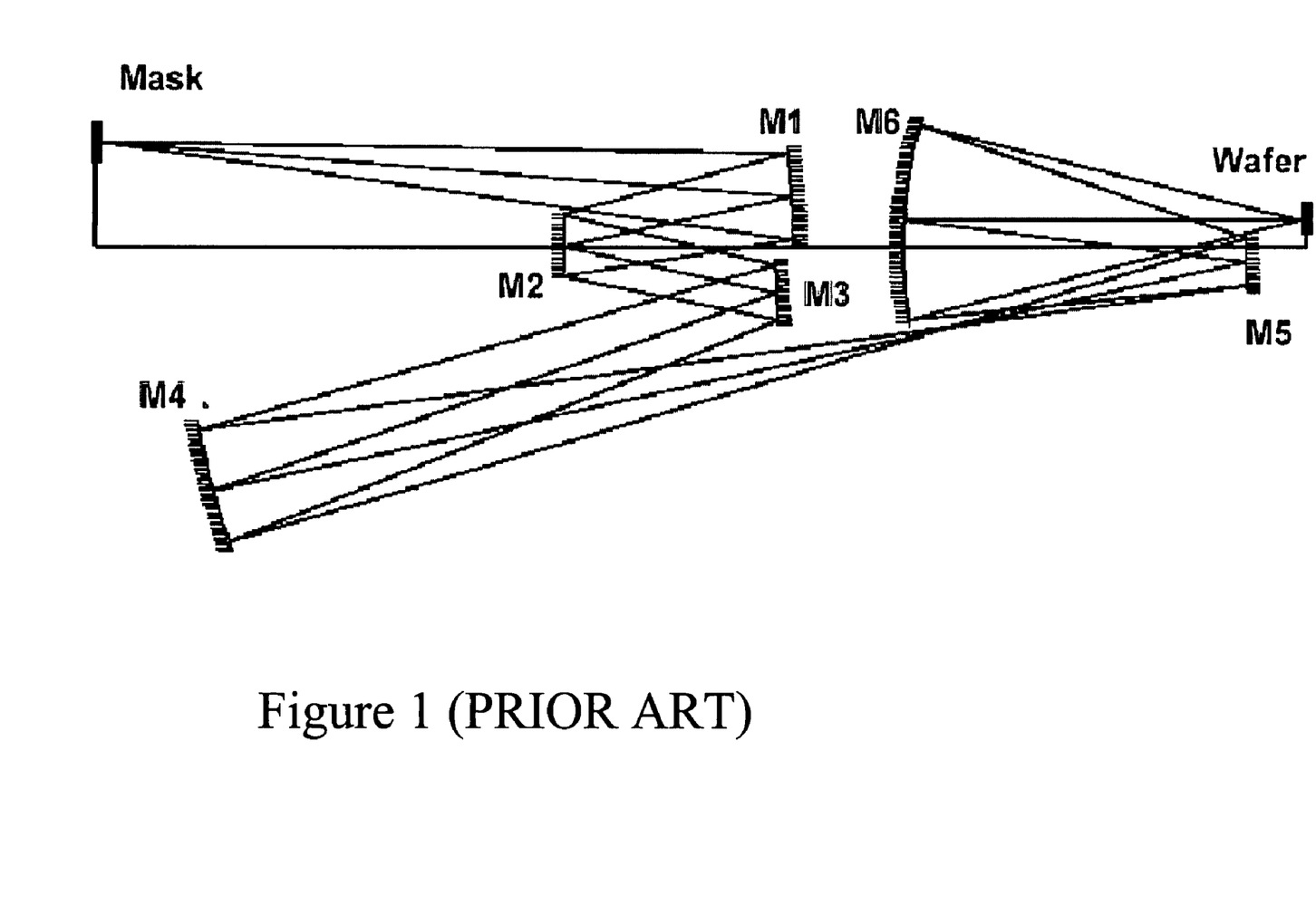
FIG. 1 illustrates a projection lithography optical system.

FIG. 1 illustrates an exemplary projection lithography optical system. The system includes a wafer, a mask and mirrors M1-M6. The system implements the typical EUV lithographic mirrors discussed above, having approximately 40 bi-layers of Mo/Si pair and a NA of 0.25. The period of the ML structure is 6.9 nm, with 4.1 nm of a Si layer and 2.8 nm of a Mo layer.

Figure 2A:
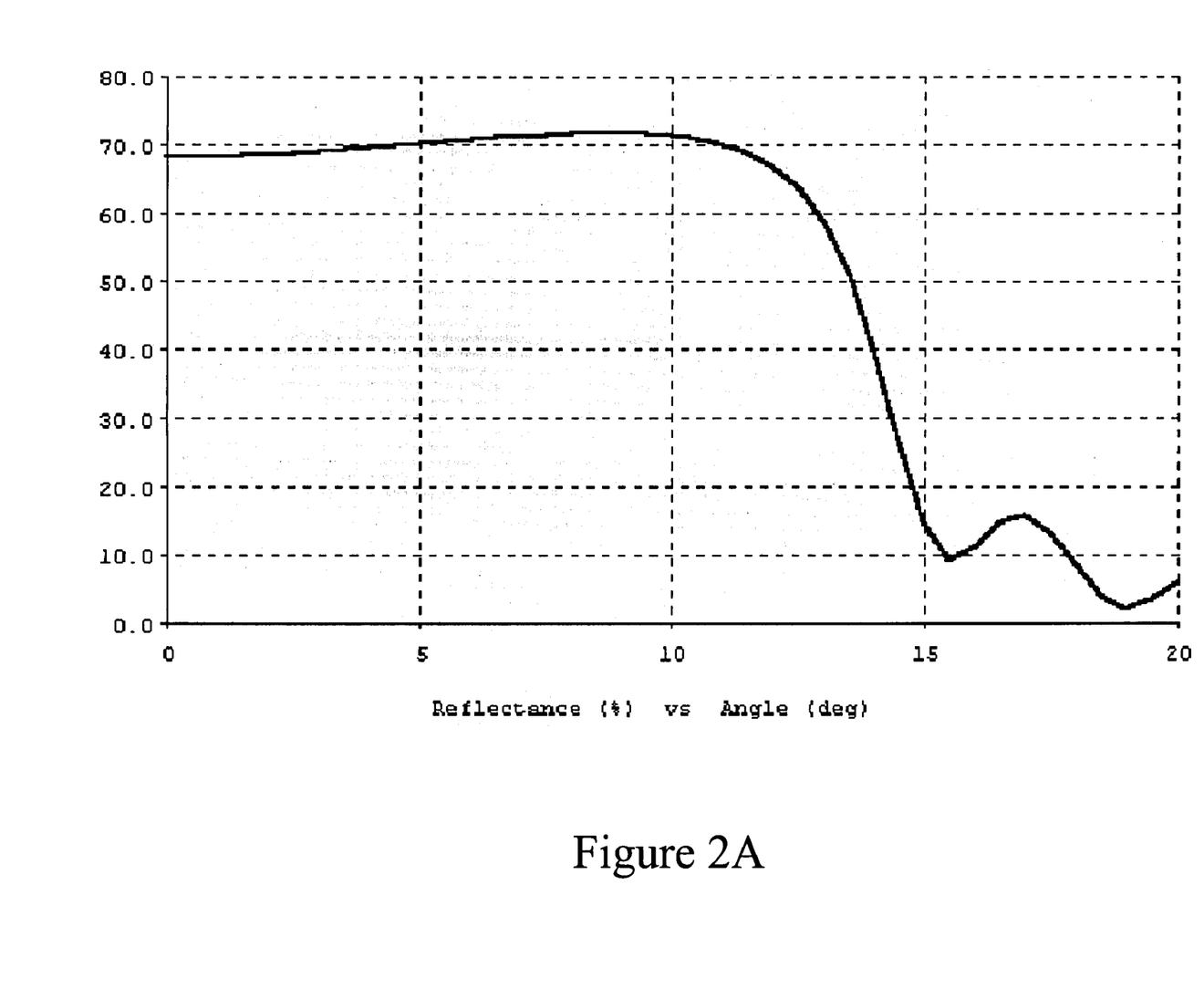
FIG. 2A is a graph illustrating one embodiment of reflectivity as a function of incident angle.
Figure 2B:
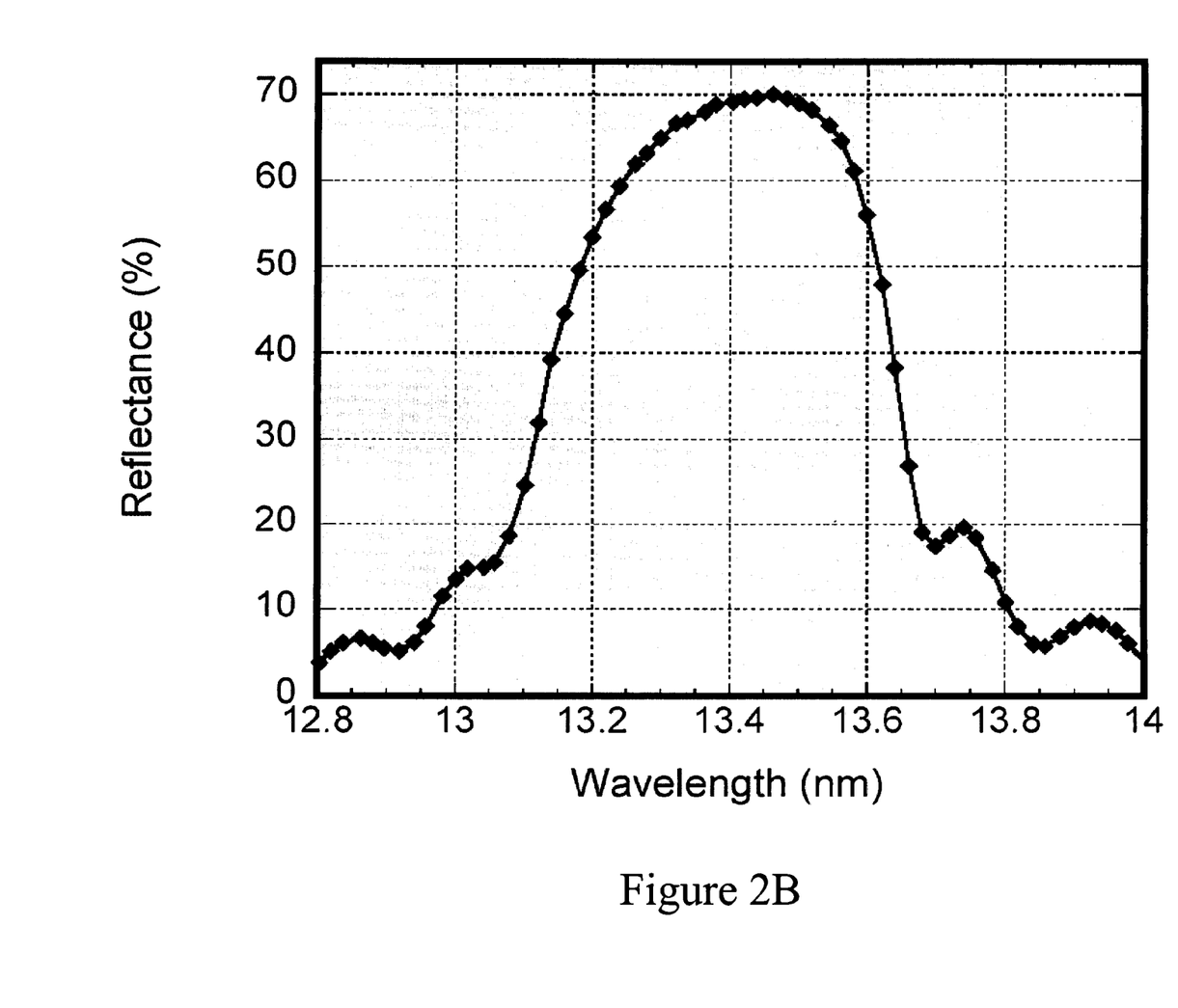
FIG. 2B is a graph illustrating one embodiment of reflectivity versus wavelength.
Figure 2C:
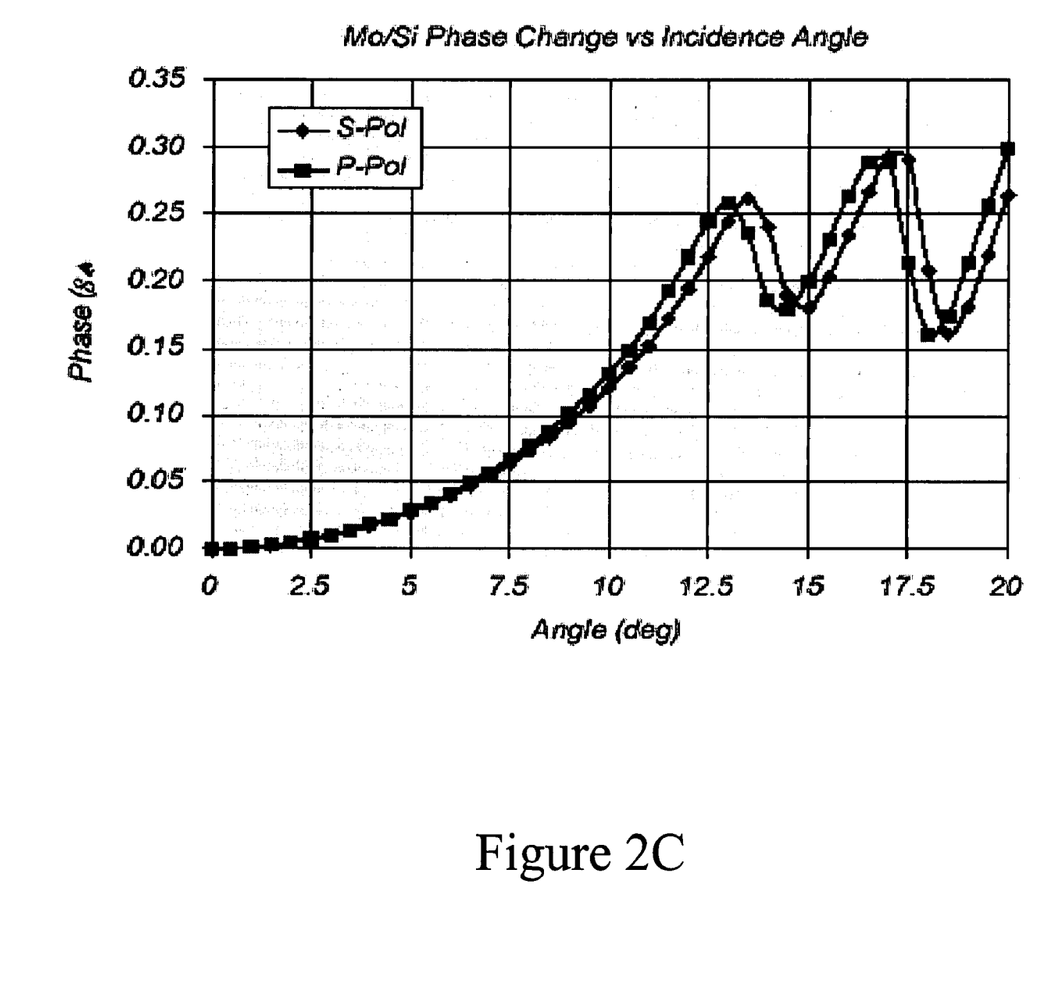
FIG. 2C is a graph illustrating one embodiment of phase shifts upon reflection of a ML mirror.

FIGS. 2A-2C illustrate reflectivity as a function of incident angle, reflectivity as a function of wavelength, and phase shifts of the reflected light, respectively, for conventional 40 bi-layers Mo/Si ML mirrors. As shown in FIG. 2A, typical ML structures have a finite range of angles that EUV light can be reflected off. Thus, the maximum angle one mirror can take with the current ML structure is approximately 12°. When the incident angle of a mirror is larger than 12°, reflectivity drops significantly and phase shift increases rapidly. This can result in pupil apodization and wavefront errors.

Also, the phase shifts of the reflected light gets larger than 20° when the incident angle is larger than 12° as shown in FIG. 2C. Such a phase shift at the large incident angles results in a large optical path length difference (OPD). Further, FIG. 2B shows the bandwidth of a 40 bi-layers ML mirror.

Referring back to FIG. 1, the optical system mask and mirrors include the following incidence angles: mask=4.3°; M1=7.9° M2=11.5°; M3=14.7°; M4=3.2°; M5=9.2, M6=3.3°.

The largest incident angle happens at M3 with 14.7°. At M3 alone, the reflectivity drops by approximately 50% of the peak reflectivity and phase shifts by approximately 20° at the edge of its pupil according to FIGS. 2A-2C. Also, if there is an attempt to increase NA to 0.35 with the 0.25 NA design, the pupil will be apodized as shown in FIG. 3.

Figure 3A:
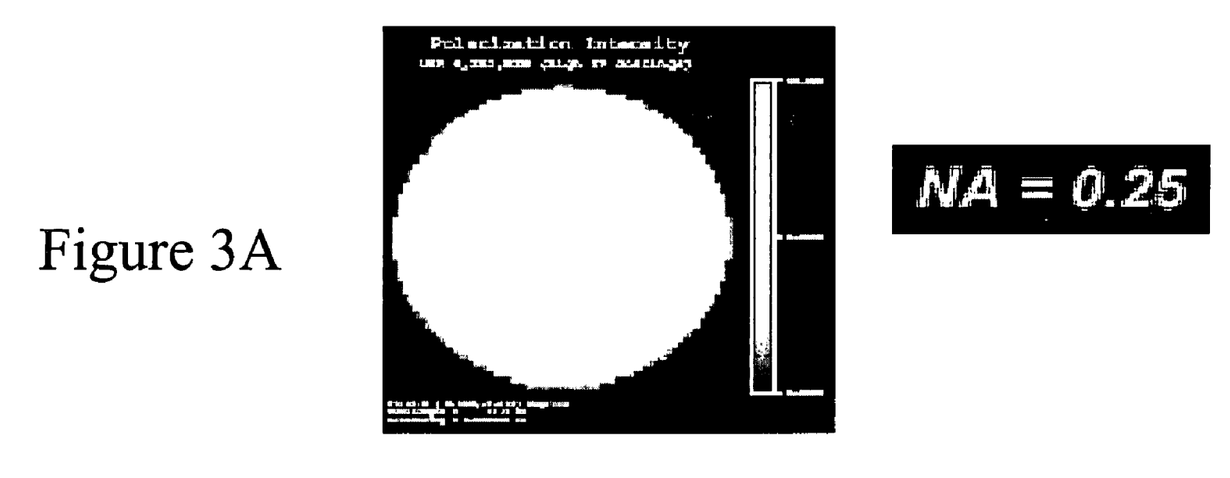
FIG. 3 illustrates one embodiment of pupil apodization for an EUV optical system.
Figure 3B:
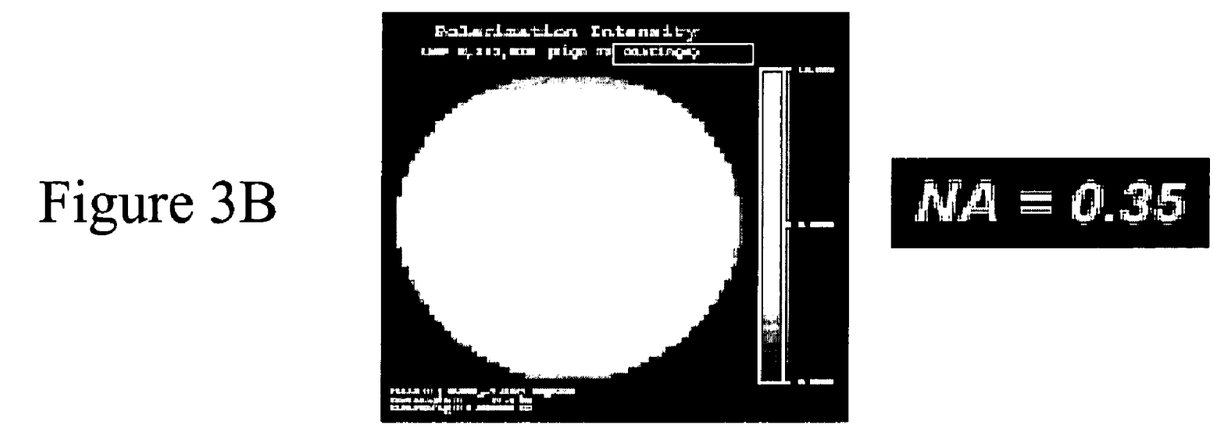

FIG. 3A shows pupil apodization for the EUV optical system 0. with the current ML structure for the 0.25 NA case, while FIG. 3B shows the 0.35 NA occurrence for the same design. Due to the incident angle limitation, more apodization is observed for the higher NA pupil. At the same time, due to the large phase shifts, large wavefront aberrations can result.

According to one embodiment, a broad-angle ML mirror is disclosed, which expands the acceptance angle beyond 20° without losing a large amount of reflectivity (less pupil apodization) and increases phase shift (lower wavefront errors) as compared to the conventional ML mirrors. In one embodiment, a broad-angle ML mirror is achieved by optimizing each layer in the multilayer structure to provide uniform reflectivity over the wider range of angles with little phase shifts. One embodiment of such a multilayer design is shown in Table 1.

Table 1 shows the material and thickness of each of the 72 layers (or 36 bi-layers) comprising a broad-angle ML mirror. According to one embodiment, the thickness of all 72 layers (or 36 bi-layers) is met to achieve the broad-angle ML mirror optimized at a 13.5 nm central wavelength.

Figure 4:
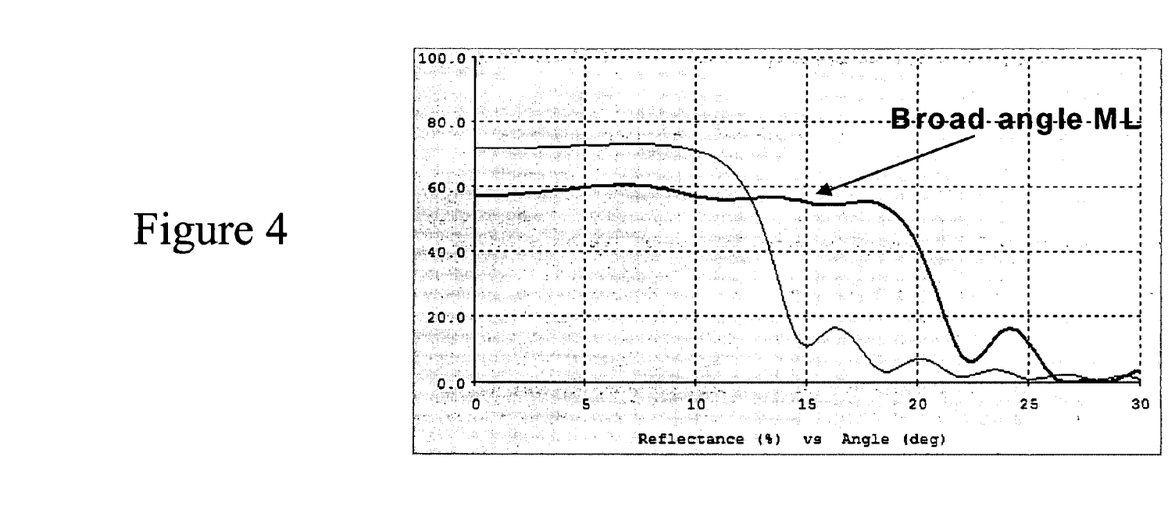
FIG. 4 is a graph illustrating one embodiment of a reflectivity curve for a ML mirror.

FIG. 4 illustrates the reflectivity curve of the broad angle ML mirror. Note that the thin line is the reflectivity plot for the typical ML mirror (e.g., identical to FIG. 1A), and the thick line is the reflectivity plot for the broad-angle ML mirror. FIG. 4 shows that the reflectivity does not drop significantly until the incident angle is large than 20°. It is also noted that the peak reflectivity of the broad-angle ML mirror is less than the current mirror.

Figure 5:
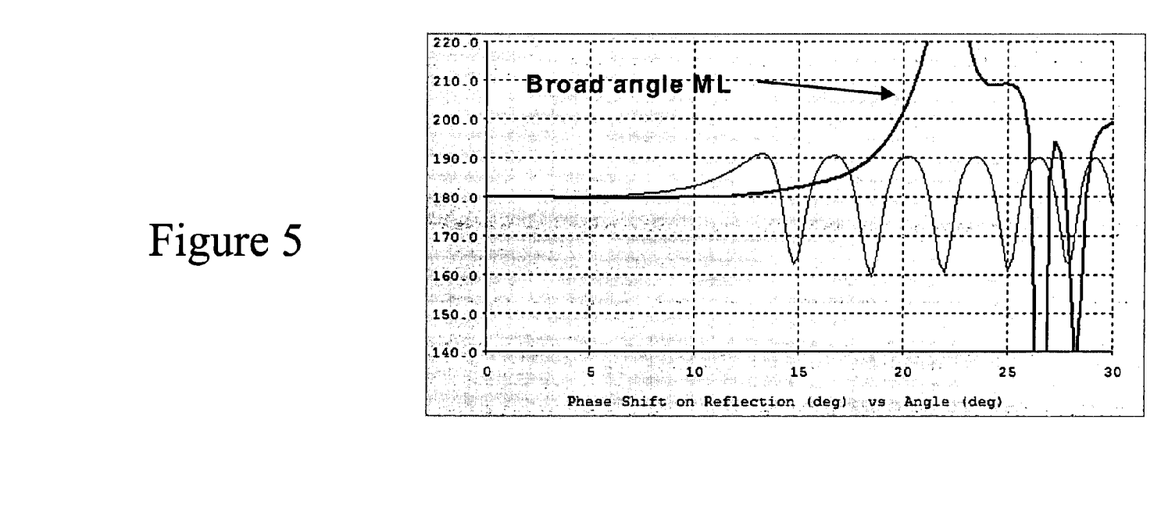
FIG. 5 is a graph illustrating one embodiment of a phase shift versus incident angle for a ML mirror.
Figure 6:
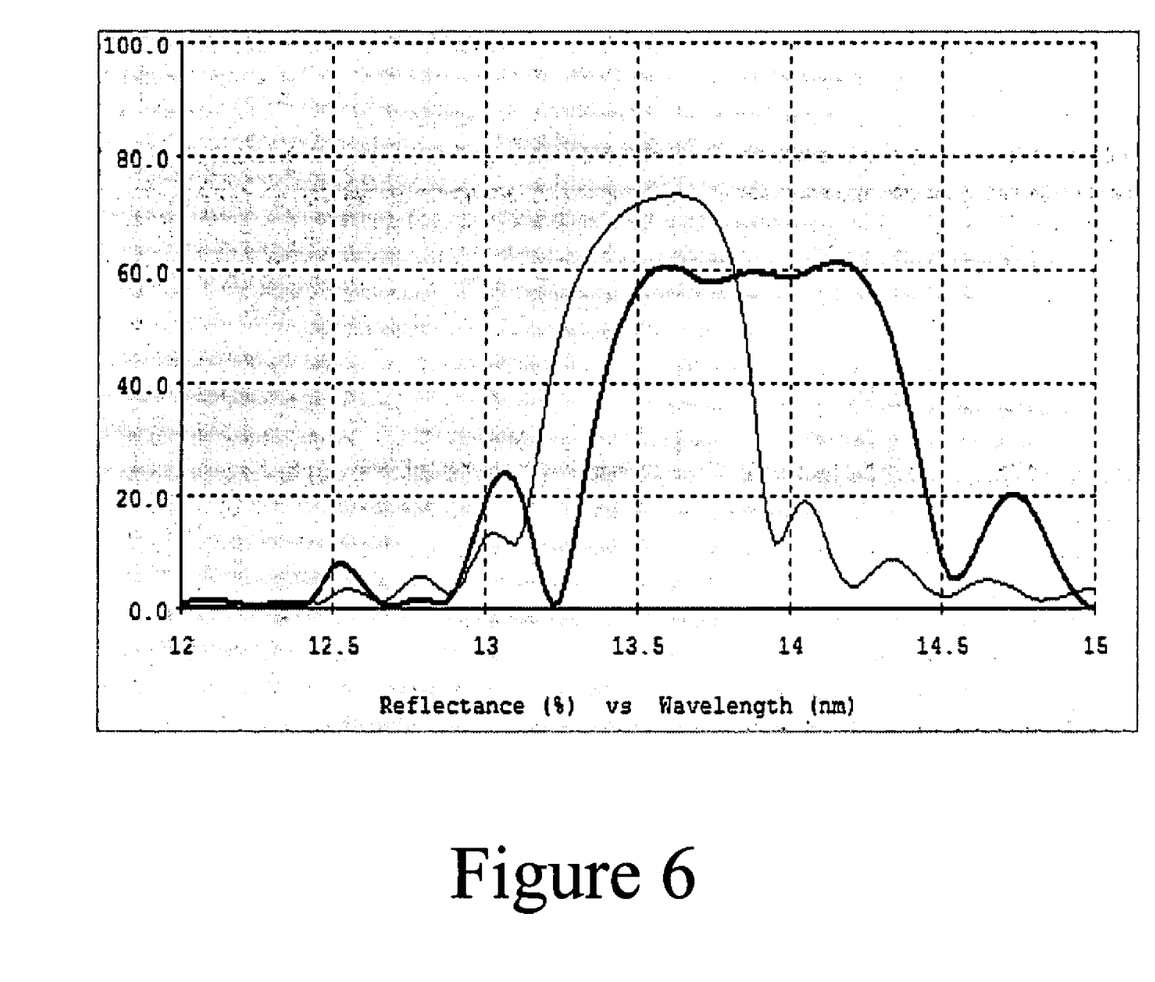
Figure 7A:
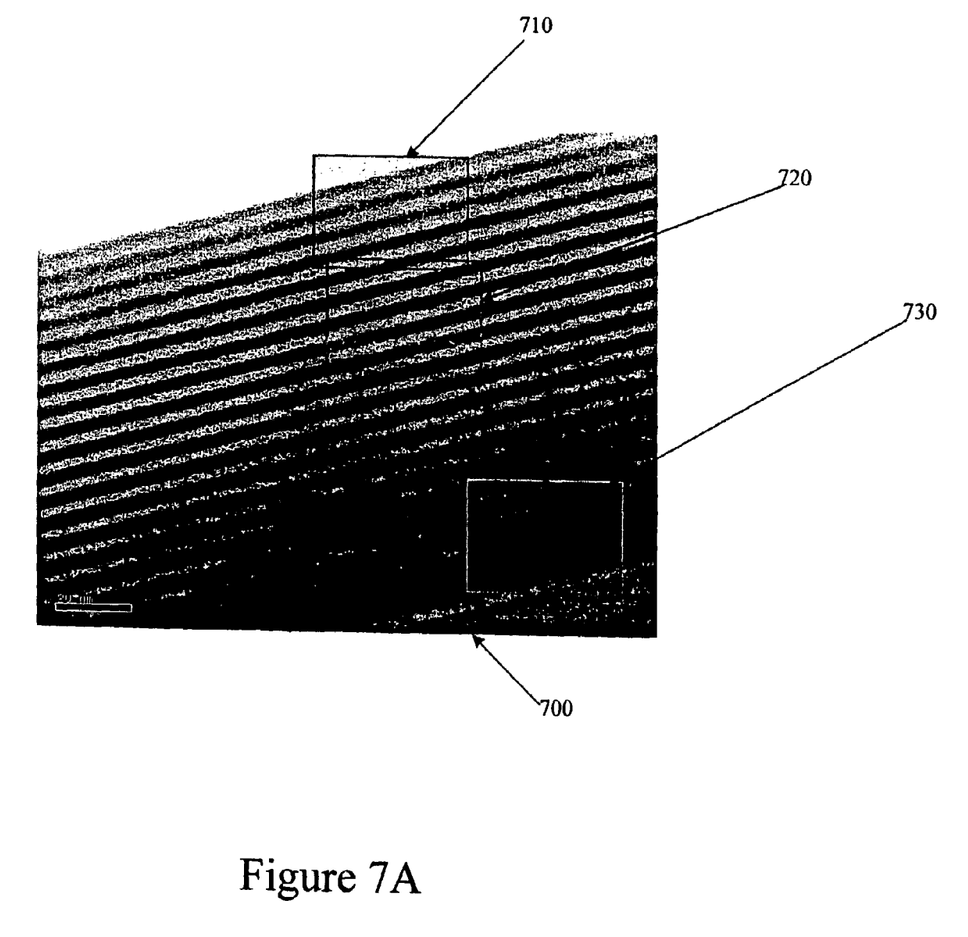
FIGS. 7A-7D illustrate bi-layers located over a substrate in a broad-angle multilayer (ML) mirror or multiple layer structure.
Figure 7B:
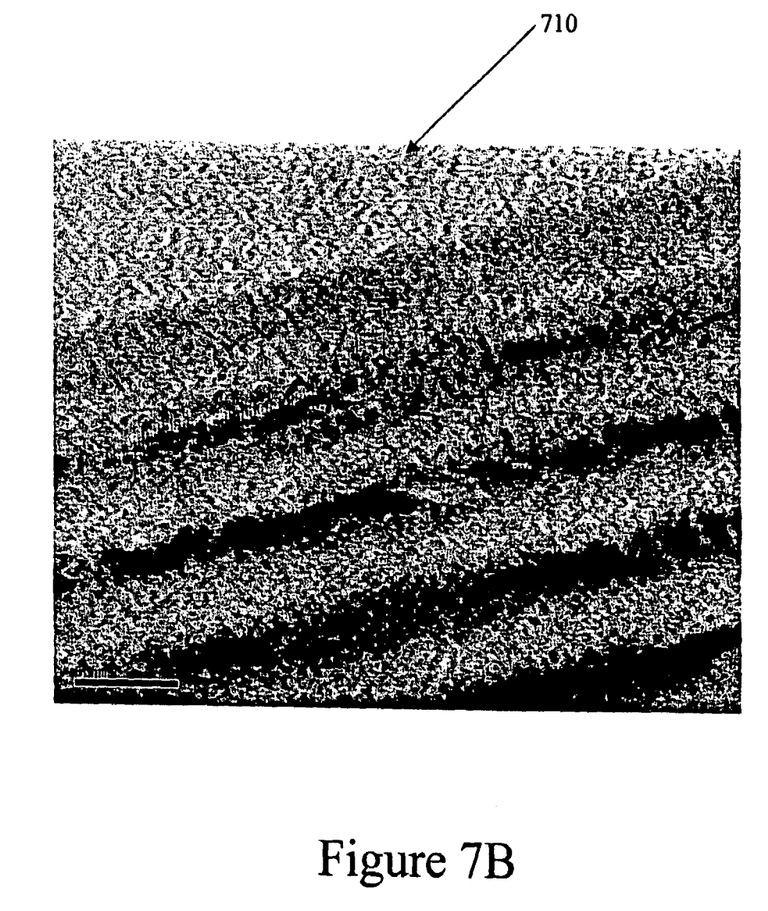
Figure 7C:
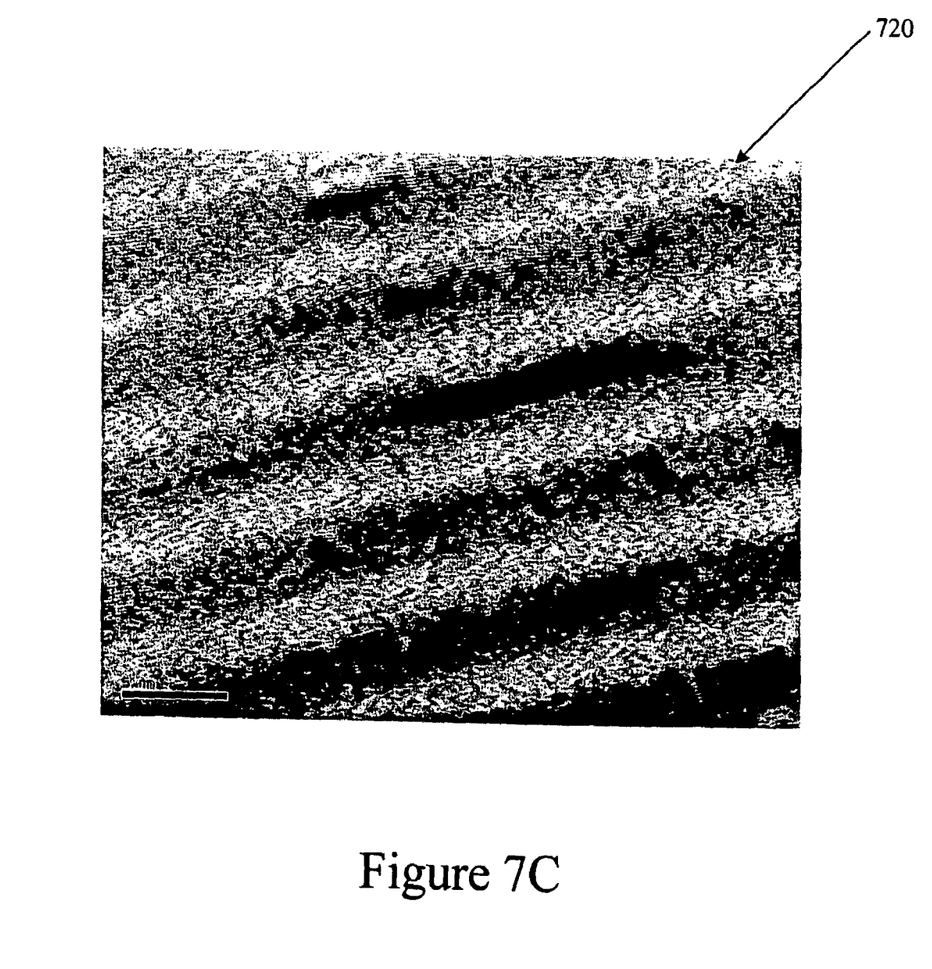
Figure 7D:
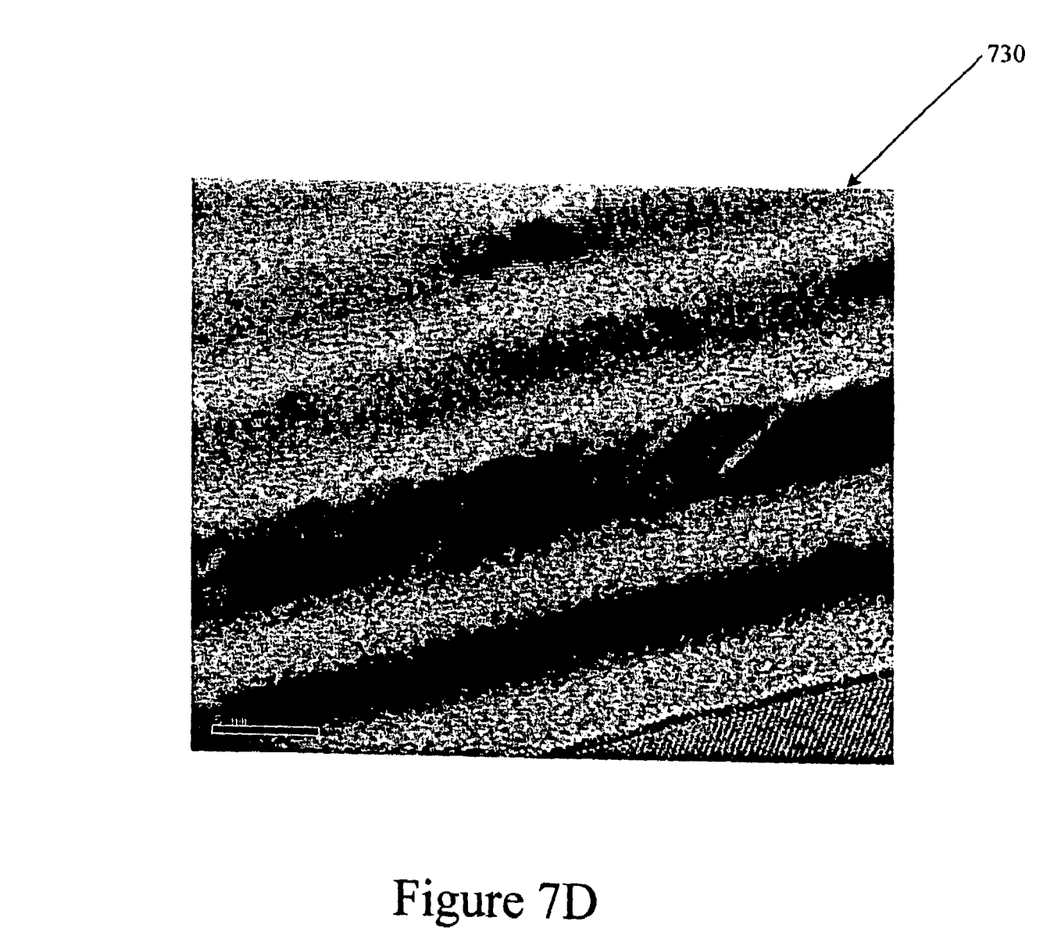

However, if the broad angle mirror is replacing only one of 6 mirrors in the system, the overall throughput loss is fairly small. FIG. 5 shows the phase shifts as a function of incident angle for the broad-angle ML mirror. Notice that less than 20° phase shifts occur at approximately the 20° incident angle. The reflectivity as a function of wavelength for the broad-angle ML mirror is also shown in FIG. 6.

TABLE 1

| Bi-layer # | Material | Thickness [nm] | Material | Thickness [nm] |
|---|---|---|---|---|
| 0 | Substrate Si | 10.48 | | |
| 1 | Mo | 11.29 | Si | 3.49 |
| 2 | Mo | 3.74 | Si | 3.5 |
| 3 | Mo | 3.73 | Si | 10.44 |
| 4 | Mo | 3.69 | Si | 3.48 |
| 5 | Mo | 3.56 | Si | 7.64 |
| 6 | Mo | 3.46 | Si | 3.5 |
| 7 | Mo | 3.63 | Si | 3.57 |
| 8 | Mo | 3.62 | Si | 3.6 |
| 9 | Mo | 3.62 | Si | 3.63 |
| 10 | Mo | 3.6 | Si | 3.66 |
| 11 | Mo | 3.56 | Si | 3.69 |
| 12 | Mo | 3.52 | Si | 3.74 |
| 13 | Mo | 3.44 | Si | 3.83 |
| 14 | Mo | 3.26 | Si | 4.06 |
| 15 | Mo | 2.41 | Si | 8.33 |
| 16 | Mo | 3.07 | Si | 3.85 |
| 17 | Mo | 3.42 | Si | 3.75 |
| 18 | Mo | 3.5 | Si | 3.72 |
| 19 | Mo | 3.53 | Si | 3.71 |
| 20 | Mo | 3.53 | Si | 3.72 |
| 21 | Mo | 3.53 | Si | 3.72 |
| 22 | Mo | 3.52 | Si | 3.73 |
| 23 | Mo | 3.51 | Si | 3.74 |
| 24 | Mo | 3.49 | Si | 3.75 |
| 25 | Mo | 3.48 | Si | 3.76 |
| 26 | Mo | 3.46 | Si | 3.78 |
| 27 | Mo | 3.44 | Si | 3.79 |
| 28 | Mo | 3.41 | Si | 3.81 |
| 29 | Mo | 3.38 | Si | 3.83 |
| 30 | Mo | 3.35 | Si | 3.86 |
| 31 | Mo | 3.31 | Si | 3.89 |
| 32 | Mo | 3.26 | Si | 3.92 |
| 33 | Mo | 3.19 | Si | 3.97 |
| 34 | Mo | 3.11 | Si | 4.03 |
| 35 | Mo | 3 | Si | 4.1 |
| 36 | Mo | 2.61 | | |
| 37 | Air | | | |

Based on the characteristics of the broad-angle ML mirror, pupil apodizations and phase shifts at the extreme angles will be reduced if mirror M3 shown in the system of FIG. 1 were replaced with the broad-angle ML mirror described in Table 1. In an embodiment of the present invention, a broad-angle multilayer (ML) mirror may include a multiple layer structure to provide uniform reflectivity over a wide range of incident angles with small phase shifts. In an embodiment of the present invention, the ML mirror or structure may include 36 bi-layers. As shown in an embodiment of the present invention in FIGS. 7A-7D, the bi-layers in the ML mirror or structure may have a variable thickness in different portions 710, 720, 730, over a substrate 700 of the ML mirror or structure. In an embodiment of the present invention as shown in Table 1, the bi-layer may include Molybdenum (Mo) with a thickness of 2.4-11.3 nm and Silicon (Si) with a thickness of 3.6-10.4 nm. In another embodiment of the present invention as shown in Table 1, Molybdenum may have a thickness of 2.4-3.7 nm except for a thicker bi-layer 1 located adjacent or nearest to the substrate and Silicon may have a thickness of 3.5-4.1 nm except for thicker bi-layers 3, 5, and 15 located farther from the substrate. In another embodiment of the present invention, the ML mirror or structure may include additional bi-layers. More than thirty-six bi-layers may be located over the substrate. The additional bi-layers may include Mo/Si bi-layers. The additional bi-layers may have a variable thickness.

Moreover, the broad-angle mirror enables a design to be extended to higher NA optics with the same number of mirrors. Thus, in a lithography perspective, the broad-angle ML mirror is very attractive due to the high NA optics with the same amount of flare and low aberrations.

The above-described invention broad-angle ML mirror, which provides a EUV mirror with a special ML structure. The maximum acceptance angle of the broad-angle ML mirror can be increased to approximately 20° by optimizing individual layer (Mo and Si layers) thickness for a 72-layer (or 36 bi-layers) structure. At this maximum angle, approximately 17% reflectivity loss with approximately 20° phase shifts occurs. The broad-angle mirror can be very useful in high NA EUV optical designs. By using the broad-angle ML mirror, pupil apodization may be reduced for the same NA optics, and higher NA optical designs can be achieved while keeping the same number of optical elements in the system.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A broad-angle multilayer ML mirror comprising a multiple layer structure over a substrate to provide uniform reflectivity over a wide range of incident angles with small phase shifts, the multiple layer structure comprising Molybdenum/Silicon bi-layers with an extra thick layer of Molybdenum next to the substrate and an extra thick layer of Silicon near the substrate.

2. The broad-angle ML mirror of claim 1 wherein the extra thick layer of molybdenum is in a first bi-layer over the substrate.

3. The broad-angle ML mirror of claim 1 wherein the extra thick layer of Silicon is in a third bi-layer over the substrate.

4. An optical system having an extreme ultra-violet (EUV) radiation source, the optical system comprising:
    a mask;
    a wafer; and
    a plurality of reflecting surfaces for imaging the mask on the wafer, including:

a broad-angle mirror having a multiple layer structure over a substrate to provide uniform reflectivity over a wide range of the angles with small phase shifts, the broad-angle mirror comprising bi-layers with an extra thick layer of Molybdenum next to the substrate; and an extra thick layer of Silicon near the substrate.

5. The optical system of claim 4 wherein the extra thick layer of Molybdenum is in a first bi-layer over the substrate.

6. The optical system of claim 4 wherein the extra thick layer of Silicon is in a third bi-layer over the substrate.

* * * * *